(12) United States Patent
Ito

(10) Patent No.: US 7,674,865 B2
(45) Date of Patent: Mar. 9, 2010

(54) PHOTOSEMICONDUCTOR ENCAPSULANT OF EPOXY RESIN, ANHYDRIDE AND AROMATIC SILICONE RESIN

(75) Inventor: Hisataka Ito, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 257 days.

(21) Appl. No.: 11/364,191

(22) Filed: Mar. 1, 2006

(65) Prior Publication Data
US 2006/0204760 A1 Sep. 14, 2006

(30) Foreign Application Priority Data
Mar. 1, 2005 (JP) .......................... P. 2005-056028

(51) Int. Cl.
| C08K 5/13 | (2006.01) |
| C08K 5/17 | (2006.01) |
| C08K 5/36 | (2006.01) |
| C08K 5/49 | (2006.01) |
| C08L 63/00 | (2006.01) |
| C08L 63/02 | (2006.01) |
| C08L 63/06 | (2006.01) |
| H01L 23/29 | (2006.01) |

(52) U.S. Cl. .................. 525/476; 257/791; 257/793; 523/451; 523/453; 523/456; 523/461

(58) Field of Classification Search ...................... None
See application file for complete search history.

(56) References Cited

U.S. PATENT DOCUMENTS

| 4,490,513 A * | 12/1984 | Minami et al. ............... 526/128 |
| 4,877,837 A * | 10/1989 | Reising et al. ............... 525/100 |
| 5,108,824 A | 4/1992 | Wang et al. |
| 6,630,745 B1 | 10/2003 | Osada et al. |
| 6,664,318 B1 | 12/2003 | Bymark et al. |
| 6,800,373 B2 * | 10/2004 | Gorczyca .................... 428/447 |
| 7,268,181 B2 * | 9/2007 | Hucke et al. ................ 524/588 |
| 2004/0067366 A1 | 4/2004 | Gorczyca |
| 2005/0082691 A1* | 4/2005 | Ito et al. ..................... 257/788 |

FOREIGN PATENT DOCUMENTS

| CN | 1534074 A | 10/2004 |
| JP | 60-70781 A | 4/1985 |
| JP | 7-25987 A | 1/1995 |
| JP | 7-309927 A | 11/1995 |

OTHER PUBLICATIONS

HCAPLUS accession No. 1985:569683, Chemical abstracts registry No. 196086-26-7 for SH-6018 and Derwent accession No. 1985-132248 for Japanese Patent No. 60-70781, Matsumoto et al., Apr. 22, 1985, three pages.*
Chinese Office Action dated Dec. 21, 2007.

* cited by examiner

*Primary Examiner*—Robert Sellers
(74) *Attorney, Agent, or Firm*—Sughrue Mion, PLLC

(57) ABSTRACT

An epoxy resin composition for photosemiconductor element encapsulation, which is excellent in both light transmissibility and low stress property, as well as light resistance against short wavelength light (for example, 350 to 500 nm), is provided. The epoxy resin composition for photosemiconductor element encapsulation, which comprises the following components (A) to (C):
(A) an epoxy resin,
(B) an acid anhydride curing agent, and
(C) a specific silicone resin.

4 Claims, No Drawings

PHOTOSEMICONDUCTOR ENCAPSULANT OF EPOXY RESIN, ANHYDRIDE AND AROMATIC SILICONE RESIN

FIELD OF THE INVENTION

The present invention relates to an epoxy resin composition for photosemiconductor element encapsulation, which is excellent in both light transmissibility and low stress property, as well as in light resistance even against short wavelength light (for example, 350 to 500 nm), and to a photosemiconductor device encapsulated with the same.

BACKGROUND OF THE INVENTION

As the resin composition for encapsulation which is used for encapsulating photosemiconductor elements such as light emitting diodes (LED) and the like, a cured product thereof is required to have transparency. In general, epoxy resin compositions obtained by using epoxy resins such as bisphenol A-type epoxy resins, alicyclic epoxy resins or the like, and acid anhydrides as the curing agent, are commonly used.

In view of its transparency, heat resistance and light resistance, there have been proposed an epoxy resin composition obtained by employing the alicyclic epoxy resin represented by the following structural formula (b) (see Document 1) and a method of modifying the epoxy resin with silicone, decreasing the elastic modulus, and reducing the internal stress (see Document 2).

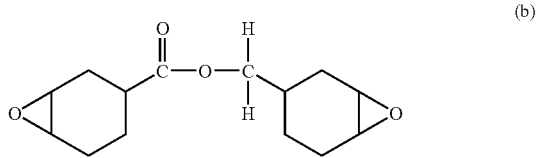

(b)

Document 1: Unexamined published Japanese patent application No. 7-309927

Document 2: Unexamined published Japanese patent application No. 7-25987

SUMMARY OF THE INVENTION

However, in the case where the epoxy resin composition obtained by using the alicyclic epoxy resin represented by the following structural formula (b) is used to produce a photosemiconductor device and the wavelengths of the emitted light are short, there appears a problem that light resistance of the resin composition against the short wavelength light (350 to 500 nm) is not satisfactory. Although the method of modifying the epoxy resin with silicone may decrease the elastic modulus, it increases the linear expansion coefficient, and thus there is a problem that a significant effect on the lowering of stress cannot be obtained totally. Thus, there is a need for an epoxy resin composition which has excellent light resistance and low stress property due to reduced linear expansion coefficient, as compared with the conventional encapsulating materials, and can be used as an encapsulating material having high reliability.

The present invention was accomplished under such circumstances. An object of the present invention is to provide an epoxy resin composition for photosemiconductor element encapsulation, which has excellent stress relaxation property against the mechanical stress due to increased linear thermal expansion coefficient and, in particular, excellent light resistance against short wavelength light, as well as a photosemiconductor device of high reliability using the same.

The first aspect of the present invention is an epoxy resin composition for photosemiconductor element encapsulation, which comprises the following components (A) to (C):

(A) an epoxy resin,
(B) an acid anhydride curing agent, and
(C) a silicone resin having the constituent siloxane unit represented by the following general formula (1) and having at least one hydroxyl group or alkoxy group bonded to a silicon atom per molecule, wherein substituted or unsubstituted aromatic hydrocarbon groups occupy 10% by mole or greater among the monovalent hydrocarbon groups (R) bonded to silicon atoms:

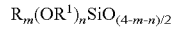

$R_m(OR^1)_n SiO_{(4-m-n)/2}$ wherein R is a substituted or unsubstituted, saturated monovalent hydrocarbon group having 1 to 18 carbon atoms or aromatic hydrocarbon group having 6 to 18 carbon atoms, and a plurality of R may be the same or different; $R^1$ is a hydrogen atom or an alkyl group having 1 to 6 carbon atoms, and a plurality of $R^1$ may be the same or different; and m and n are respectively an integer from 0 to 3.

The second aspect of the present invention is a photosemiconductor device, wherein a photosemiconductor element is resin-encapsulated with the above-described epoxy resin composition for photosemiconductor element encapsulation.

The inventors of the present invention conducted a series of studies to obtain an epoxy resin composition which is capable of overcoming the disadvantages that the conventional epoxy resin composition obtained from the alicyclic epoxy resin which has the characteristics of light resistance and heat resistance leads to low light resistance to shorter wavelength light, and that modification of the epoxy resin with silicone leads to decrease in the low stress property. Then, they focused on a silicone resin to be blended as an encapsulating material and carried out further studies in order to find a silicone resin which is capable of overcoming the above-described disadvantages. As a result, they unexpectedly found that use of the above-described specific silicone resins can provide excellent resistances to light deterioration and stress relaxation property. That is, they found that use of the above-described specific silicone resin can achieve reduction of internal stress without lowering light transmissibility and that it can suppress the increase in the linear expansion coefficient of the cured product derived from the siloxane unit which has a specific skeleton structure. Based on such unexpected finding, the inventors accomplished the present invention.

The present invention is directed to an epoxy resin composition which comprises the above-described specific silicone resin [component (C)]. Since the above-described specific silicone resin is compatible in the system, reduction in the internal stress of the cured product is realized without decreasing the light transmission. Further, it can exhibit excellent light resistance, in particular, against short wavelength light and effectively prevent the deterioration of the photosemiconductor device. Accordingly, the photosemiconductor device in which a photosemiconductor element is encapsulated with the epoxy resin composition for photosemiconductor element encapsulation according to the present invention has excellent reliability and can satisfactorily perform the device function.

When the siloxane unit constituting the above-described silicone resin [component C] is represented by the specific structural formulas (2) through (5) and the respective constitutional ratios for the units A1 through A4 are set to the specific ranges, low stress encapsulation property can be obtained When the monovalent hydrocarbon groups (R) bonded to silicon atoms of the above-described silicone resin [component C] are a methyl group and a phenyl group, the compatibility with the epoxy resin (component A) is improved.

Further, when the silicone resin [component C] has a softening point of 150° C. or lower or is liquid at ambient temperature and is simultaneously compatible with the epoxy resin homogeneously, it can be easily mixed during melt mixing.

DETAILED DESCRIPTION OF THE INVENTION

The epoxy resin composition for photosemiconductor element encapsulation of the present invention is obtained from an epoxy resin composition which comprises an epoxy resin (component A), an acid anhydride curing agent (component B) and a specific silicone resin (component C). In the present invention, the term "ambient temperature" refers to a temperature in the range of from 5 to 35° C.

The epoxy resin (component A) is not particularly limited, and a variety of conventionally known epoxy resins, for example, bisphenol A type epoxy resins, bisphenol F type epoxy resins, novolac type epoxy resins such as phenol novolac type epoxy resins or cresol novolac type epoxy resins, alicyclic epoxy resins, nitrogen-containing cyclic epoxy resins such as triglycidyl isocyanurates and hydantoin epoxy resins, hydrogenated bisphenol A type epoxy resins, aliphatic epoxy resins, glycidyl ether type epoxy resins, bisphenol S type epoxy resins, biphenyl type epoxy resins which constitute the main stream of low water absorbing cured products, dicyclo ring type epoxy resins, naphthalene type epoxy resins and the like may be mentioned. These can be used individually or in combination of two or more species. Among these epoxy resins, a triglycidyl isocyanurate represented by the following structural formula (a) and an alicyclic epoxy resin represented by the following structural formula (b) are preferably used, in view of their excellent transparency and resistance to discoloration:

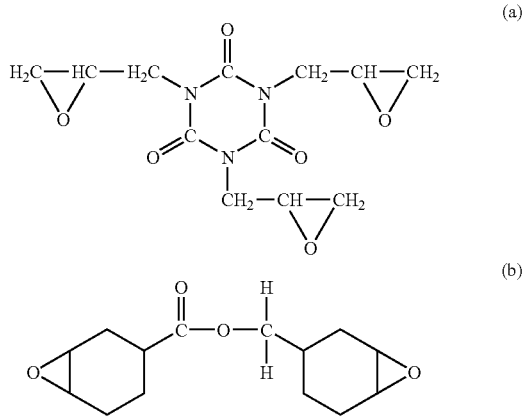

The epoxy resin (component A) may be solid or liquid at ambient temperature. However, the average epoxy equivalent of the epoxy resin used is preferably 90 to 1000. When the epoxy resin is solid, the softening point is preferably 160° C. or lower. When the epoxy equivalent is less than 90, the cured product of epoxy resin composition for photosemiconductor element encapsulation may become brittle. On the other hand, when the epoxy equivalent exceeds 1000, the glass transition temperature (Tg) of the cured product may be lowered.

Examples of the acid anhydride curing agent (component B) which is used together with the epoxy resin (component A) include phthalic anhydride, maleic anhydride, trimellic anhydride, pyromellic anhydride, hexahydrophthalic anhydride, tetrahydrophthalic anhydride, methylnadic anhydride, nadic anhydride, glutaric anhydride, methylhexahydrophthalic anhydride, methyltetrahydrophthalic anhydride, and the like. These may be used individually or in combination of two or more species. Among these acid anhydride curing agents, phthalic anhydride, hexahydrophthalic anhydride, tetrahydrophthalic anhydride, or methylhexahydrophthalic anhydride is preferably used. The acid anhydride curing agent preferably has a molecular weight of about 140 to 200, and an acid anhydride which is colorless or pale yellow colored is preferably used.

The mixing ratio of the epoxy resin (component A) and the acid anhydride curing product (component B) is preferably set to a ratio such that 0.5 to 1.5 equivalents, more preferably 0.7 to 1.2 equivalents, of the active group in the acid anhydride curing agent (component B) (an acid anhydride group or a hydroxyl group in the case of the below-described phenol resin), which is capable of reacting with the epoxy group, is used with respect to 1 equivalent of the epoxy group in the epoxy resin (component A). When less than 0.5 equivalent of the active group are used, there is a tendency that the curing rate of the epoxy resin composition for photosemiconductor element encapsulation is reduced, and at the same time, the glass transition temperature (Tg) of the cured product is lowered. When more than 1.5 equivalents are used, there is a tendency that moisture resistance decreases.

Furthermore, in addition to the acid anhydride curing product (component B), conventionally known curing agents for epoxy resin, for example, phenolic resin-based curing agents, amine-based curing agents, the products of partial esterification of the acid anhydride curing agents with alcohol, or carboxylic acid curing agents such as hexahydrophthalic acid, tetrahydrophthalic acid, methylhexahydrophthalic acid and the like, may be used in combination with the acid anhydride curing agent, in accordance with the purpose and application. For example, when a carboxylic acid curing agent is used in combination, the curing rate can be increased, and thus productivity can be improved. When these curing agents are used, the mixing ratio may be similar to the mixing ratio (equivalent ratio) for the case where the acid anhydride curing agent is used.

The specific silicone resin (component C) that is used together with the component A and component B, which is usually called polyorganosiloxane, is a polymer having a crosslinked structure with a siloxane bond. The specific silicone resin (component C) is characterized in that it has a constituent siloxane unit represented by the following general formula (1), and also has at least one hydroxyl group or alkoxy group is bonded to a silicon atom per molecule, and among the monovalent hydrocarbon groups (R) bonded to silicon atoms, substituted or unsubstituted aromatic hydrocarbon groups occupy 10% by mole or greater.

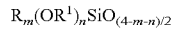

$$R_m(OR^1)_n SiO_{(4-m-n)/2}$$

wherein R is a substituted or unsubstituted, saturated monovalent hydrocarbon group having 1 to 18 carbon atoms or aromatic hydrocarbon group having 6 to 18 carbon atoms, and a plurality of R may be the same or different; $R^1$ is a hydrogen atom or an alkyl group having 1 to 6 carbon atoms, and a plurality of $R^1$ may be the same or different; and m and n are each an integer from 0 to 3.

In the formula (1) above, for the substituted or unsubstituted, saturated monovalent hydrocarbon group R having 1 to 18 carbon atoms, specific examples of the unsubstituted, saturated monovalent hydrocarbon group include straight-chained or branched alkyl groups such as a methyl group, an ethyl group, a propyl group, an isopropyl group, an n-butyl group, an isobutyl group, a t-butyl group, a pentyl group, an isopentyl group, a hexyl group, an isohexyl group, a heptyl group, an isoheptyl group, an octyl group, an isooctyl group, a nonyl group, a decyl group and the like; cycloalkyl groups such as a cyclopentyl group, a cyclohexyl group, a cyclooctyl group, a tricyclo(5.2.1.0(2,6))decyl group, a decahydronaphthyl group and the like; aromatic groups such as an aryl group, such as a phenyl group, a naphthyl group, a tetrahydronaphthyl group, a tolyl group, an ethylphenyl group and the like, and an aralkyl group, such as a benzyl group, a phenylethyl group, a phenylpropyl group, a methylbenzyl group and the like; and the like.

Meanwhile, for R in the above formula (1), the substituted, saturated monovalent hydrocarbon group may be exemplified by those having part or all of the hydrogen atoms in the hydrocarbon group substituted with halogen atoms, cyano groups, amino groups, epoxy groups or the like, and specific examples thereof include substituted hydrocarbon groups such as a chloromethyl group, a 2-bromoethyl group, a 3,3,3-trifluoropropyl group, a 3-chloropropyl group, a chlorophenyl group, a dibromophenyl group, a difluorophenyl group, a β-cyanoethyl group, a γ-cyanopropyl group and a β-cyanopropyl group, and the like.

In the above-described specific silicone resin (component C), for the R in the above formula (1), preferred are an alkyl group or an aryl group from the viewpoints of compatibility with the epoxy resin and the properties of the resulting epoxy resin composition. For the alkyl group, more preferred examples include alkyl groups having 1 to 3 carbon atoms, and particularly preferred is a methyl group. For the aryl group, particularly preferred is a phenyl group. These groups selected for R in the above formula (1) may be the same or different among the same siloxane unit, or among different siloxane units.

For the above-described specific silicone resin (component C), it is necessary that in its structure, 10% by mole or greater of the monovalent hydrocarbon groups (R) bonded to silicon atoms are selected from aromatic hydrocarbon groups. Specifically, at the rate of less than 10% by mole, the compatibility with the epoxy resin may be insufficient, and thus the silicone resin dissolved or dispersed in the epoxy resin may turn the epoxy resin opaque. Also, the cured product of the resulting resin composition may not provide sufficient effects in the light resistance and physical properties. The content of the aromatic hydrocarbon group as such is more preferably 30% by mole or greater, and particularly preferably 40% by mole or greater. The upper limit for the content of the aromatic hydrocarbon group is 100% by mole.

The group $(OR^1)$ in the above formula (1) is a hydroxyl group or an alkoxy group, and $R^1$ in the case where $(OR^1)$ is an alkoxy group may be exemplified by the alkyl groups having 1 to 6 carbon atoms among the alkyl groups listed specifically for the above-described R. More specifically, $R^1$ may be exemplified by a methyl group, an ethyl group, or an isopropyl group. These groups may be the same or different among the same siloxane unit, or among different siloxane units.

The above-described specific silicone resin (component C) preferably has at least one hydroxyl group or alkoxy group that is bonded to a silicon atom per molecule, that is, an $(OR^1)$ group of formula (1) in at least one siloxane unit constituting the silicone resin. When the silicone resin does not have the hydroxyl group or alkoxy group, the compatibility with the epoxy resin is insufficient, and it is impossible to obtain satisfactory physical properties in the cured product formed by the resulting resin composition. For the reason thereof, it may be considered that these hydroxyl groups or alkoxy groups function in a certain manner in the curing reaction of the epoxy resin, although the exact mechanism is not clear. With respect to the silicone resin (component C), the amount of the hydroxyl group or alkoxy group bonded to silicon atom is preferably set to the range of 0.1 to 15% by weight, more preferably 1 to 10% by weight, in terms of the OH group. When the amount of the hydroxyl group or alkoxy group is beyond the above-mentioned range, the compatibility with the epoxy resin (component A) may decrease, and in particular, when the amount exceeds 15% by weight, there is a possibility that the hydroxyl group or alkoxy group causes autodehydration or dealcoholation.

In the above formula (1), the repeating numbers m and n are respectively an integer from 0 to 3. The values that can be taken by the repeating numbers m and n may vary for different siloxane units, and in explaining the siloxane unit constituting the particular silicone resin in more detail, the units A1 through A4 represented by the following general formulas (2) through (5) may be mentioned.

$$\text{Unit A1:}(R)_3SiO_{1/2} \quad (2)$$

$$\text{Unit A2:}(R)_2(OR^1)_nSiO_{(2-n)/2} \quad (3)$$

wherein n is 0 or 1.

$$\text{Unit A3:}(R)(OR^1)_nSiO_{(3-n)/2} \quad (4)$$

wherein n is 0, 1 or 2.

$$\text{Unit A4:}(OR^1)_nSiO_{(4-n)/2} \quad (5)$$

wherein n is an integer from 0 to 3.

In the formulas (2) through (5), R is a substituted or unsubstituted, saturated monovalent hydrocarbon group having 1 to 18 carbon atoms or aromatic hydrocarbon group having 6 to 18 carbon atoms, and a plurality of R may be the same or different; and $R^1$ is a hydrogen atom or an alkyl group having 1 to 6 carbon atoms, and a plurality of $R^1$ may be the same or different.

Thus, for m in the above formula (1), the case where m=3 corresponds to the unit A1 represented by the above formula (2); the case where m=2 to the unit A2 represented by the above formula (3); the case where m=1 to the unit A3 represented by the above formula (4); and the case where m=0 to the unit A4 represented by the above formula (5). Among these, the unit A1 represented by the above formula (2) is a structural unit having only one siloxane bond and constituting the terminal group, while the unit A2 represented by the above formula (3) is a structural unit having two siloxane bonds when n is 0, and constituting a siloxane bonding in a linear form. In the case where n is 0 with respect to the unit A3 represented by the above formula (4), and in the case where n is 0 or 1 with respect to the unit A4 represented by the above formula (5), the units are structural units possibly having 3 or 4 siloxane bonds and contributing the branched structure or crosslinked structure.

For the particular silicone resin (component C), the respective constitutional ratios for the units A1 through A4 respectively represented by the above formulas (2) through (5) are preferably set to the following ratios (a) through (d).

(a) 0 to 30% by mole of unit A1,
(b) 0 to 80% by mole of unit A2,
(c) 20 to 100% by mole of unit A3, and
(d) 0 to 30% by mole of unit A4.

More preferably, unit A1 and unit A4 are contained in an amount of 0% by mole, unit A2 in an amount of 0 to 70% by mole, and unit A3 in an amount of 30 to 100% by mole. That is, when the respective constitutional ratios for the units A1 through A4 are set to the above-mentioned ranges, effects of imparting (maintaining) appropriate hardness or elastic modulus to the cured product can be obtained, which are further desirable.

The specific silicone resin (component C) has the respective constituent units bonded to each other or in a row, and the degree of polymerization of the siloxane units is preferably in the range of 6 to 10,000. The nature of the above-described specific silicone resin (component C) may vary depending on the degree of polymerization and the degree of crosslinking, and may be either in the liquid phase or in the solid phase.

The specific silicone resin (component C) represented by formula (1) can be produced by known methods. For example, the silicone resin is obtained through a reaction such as hydrolyzing at least one of organosilanes and organosiloxanes in the presence of a solvent such as toluene or the like. In particular, a method of subjecting an organochlorosilane or an organoalkoxysilane to hydrolytic condensation is generally used. Here, the organo group is a group corresponding to R in the above formula (1), such as an alkyl group, an aryl group or the like. The units A1 through A4 respectively represented by the above formulas (2) through (5) are correlated with the structure of the silanes used as the respective starting materials. For example, in the case chlorosilane, when a triorganochlorosilane is used, the unit A1 represented by formula (2) can be obtained; when a diorganodichlorosilane is used, the unit A2 represented by formula (3) can be obtained; when an organochlorosilane is used, the unit A3 represented by formula (4) can be used; and when tetrachlorosilane is used, the unit A4 represented by formula (5) can be used. In addition, the substituent of silicon atom represented by $(OR^1)$ with respect to the above formulas (1) and (3) through (5) is an uncondensed residual group of hydrolysis.

The specific silicone resin (component C) is preferably set to the range of 10 to 60% by weight of the total epoxy resin composition. Particularly preferably, the content is in the range of 20 to 40% by weight. When the content is less than 10% by weight, there is a tendency that the heat resistance and light resistance are decreased. When the content is more than 60% by weight, there is a tendency that the cured product of the obtained resin composition becomes remarkably brittle.

The epoxy resin composition for photosemiconductor element encapsulation of the present invention may suitably contain, in addition to the epoxy resin (component A), the acid anhydride curing agent (component B) and the specific silicone resin (component C), various known additives that are conventionally used, such as a curing accelerator, a deterioration inhibitor, a modifying agent, a silane coupling agent, a defoaming agent, a leveling agent, a releasing agent, dyes, pigments and the like, if desired.

The curing accelerator is not particularly limited, and may be exemplified by tertiary amines such as 1,8-diazabicyclo (5.4.0)undecene-7, triethylenediamine, tri-2,4,6-dimethylaminomethylphenol and the like; imidazoles such as 2-ethyl-4-methylimidazole, 2-methylimidazole and the like; phosphorus compounds such as triphenylphosphine, tetraphenylphosphonium.tetraphenylborate, tetra-n-butylphosphonium-o,o-diethylphosphorodithioate and the like; quaternary ammonium salts; organic metal salts; and derivatives thereof and the like. These may be used individually or in combination of two or more species. Among these curing accelerators, tertiary amines, imidazoles and phosphorus compounds are preferably used.

The content of the curing accelerator is preferably set to 0.01 to 8.0 parts by weight, and more preferably 0.1 to 3.0 parts by weight, relative to 100 parts by weight (hereinafter, abbreviated to "parts") of the epoxy resin (component A). When the content is less than 0.01 parts, it is difficult to obtain a sufficient curing accelerating effect. When the content exceeds 8.0 parts, the resulting cured product may exhibit discoloration.

The deterioration inhibitor may be exemplified by conventionally known deterioration inhibitors such as phenol compounds, amine compounds, organic sulfur compounds, phosphine compounds and the like. The modifying agent may be exemplified by conventionally known modifying agents such as glycols, silicone oils, alcohols and the like. The silane coupling agent may be exemplified by conventionally known silane coupling agents such as functional alkoxysilanes, functional alkyltitanates and the like. The defoaming agent may be exemplified by conventionally known defoaming agents such as silicones and the like.

The epoxy resin composition for photosemiconductor element encapsulation of the present invention may be prepared, for example, in the following manner, and may be obtained in the form of liquid, powder or a tablet formed from the powder. That is, in order to obtain a liquid epoxy resin composition for photosemiconductor element encapsulation, for example, the above-described components, including the epoxy resin (component A), the acid anhydride curing agent (component B) and the particular silicone resin (component C), as well as various additives that are blended in as necessary, may be appropriately blended. In order to obtain the epoxy resin composition in the form of powder or a tablet formed from the powder, the epoxy resin composition can be prepared by, for example, appropriately blending the above-described components, preliminarily mixing the components, then kneading and melt mixing the resulting mixture using a kneading machine, subsequently cooling the resulting mixture to room temperature, and then pulverizing the cooled product by a known means, and if necessary, tabletting the pulverization product.

The epoxy resin composition for photosemiconductor element encapsulation of the present invention thus obtained is used for encapsulating photosemiconductor elements such as LED, charge-coupled device (CCD) or the like. That is, encapsulation of a photosemiconductor element using the epoxy resin composition for photosemiconductor element encapsulation of the present invention is not particularly limited in the method, and may be carried out by a known molding method such as conventional transfer molding, casting or the like. When the epoxy resin composition for photosemiconductor element encapsulation of the present invention is liquid, it is favorable to use the epoxy resin composition as the so-called two-liquid type such that at least the epoxy resin component and the acid anhydride curing agent component are stored separately and mixed immediately before use. When the epoxy resin composition for photosemiconductor element encapsulation of the present invention is in the form of powder or tablet after being subjected to a predetermined aging process, the above-mentioned components are provided in the state of B stage (semi-cured state) upon melting mixing of the components, and this may be heated and melted upon use.

Furthermore, it is preferable for the cured product obtained from the epoxy resin composition for photosemiconductor element encapsulation of the present invention to have a Shore D hardness of 60 or more from the viewpoint of protecting photosemiconductor elements, and a linear expansion coefficient of 100 ppm or less from the viewpoint of reducing the internally occurring stress. The Shore D hardness can be measured using, for example, a Shore D hardness tester. The linear expansion coefficient can be determined by, for example, measuring the glass transition temperature using a thermomechanical analyzer (TMA) and calculating the linear expansion coefficient from the glass transition temperature.

By encapsulating a photosemiconductor element with the epoxy resin composition for photosemiconductor element encapsulation of the present invention, reduction of internal stress can be promoted, and decrease in the brightness of the photosemiconductor element at short wavelengths light emission can be effectively prevented. For this reason, the photosemiconductor device of the present invention, wherein a photosemiconductor element is encapsulated with the epoxy resin composition for photosemiconductor element encapsulation of the present invention, has excellent reliability and low stress property, and can satisfactorily perform the device function.

The epoxy resin composition for photosemiconductor element encapsulation the present invention can be employed for a white light emitting device using a light source at short wavelengths (for example, 350 to 500 nm), by setting light converting-fluorescent material around the light emitting element or by obtaining a white light by dispersing the fluorescent material in the epoxy resin composition for encapsulation of the present invention itself.

Next, the present invention will be described with reference to Examples and Comparative Examples.

First, the following components were prepared.

[Epoxy Resin a]

Triglycidyl isocyanurate represented by the following structural formula (a) (epoxy equivalent 100)

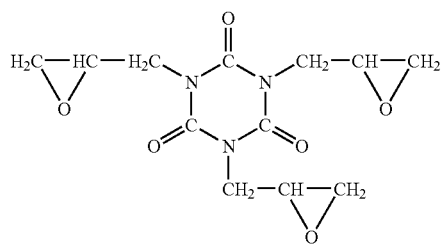

(a)

[Epoxy Resin b]

Alicyclic epoxy resin represented by the following structural formula (b) (epoxy equivalent 134)

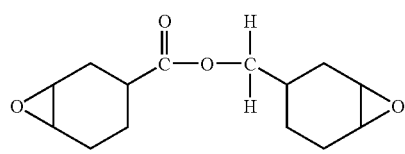

(b)

[Epoxy Resin c]

Bisphenol A-type epoxy resin (epoxy equivalent 185)

[Acid Anhydride Curing Agent]

Mixture of 4-methylhexahydrophthalic anhydride (x) and hexahydrophthalic anhydride (y) (mixing weight ratio x:y=7:3) (acid anhydride equivalent 168)

[Silicone Resin a]

A mixture containing 148.2 g (66% by mole) of phenyltrichlorosilane, 38.1 g (24% by mole) of methyltrichlorosilane, 13.7 g (10% by mole) of dimethyldichlorosilane and 215 g of toluene was added dropwise to a mixed solvent containing 550 g of water, 150 g of methanol and 150 g of toluene that had been placed in a flask in advance, over 5 minutes with vigorous agitation. The temperature in the flask was elevated to 75° C., and agitation was continued for 10 more minutes. This solution was left to stand, cooled to room temperature (25° C.). Then, the separated aqueous layer was removed, subsequently water was added, and the mixture was agitated and left to stand. The operation of washing with water to remove the aqueous layer was carried out until the washed water layer became neutral. The remaining organic layer was subjected to reflux for 30 minutes, and water and a part of toluene were distilled off. The obtained toluene solution of organosiloxane was filtered to remove any impurities, and then the residual toluene was distilled off under reduced pressure using a rotary evaporator, thus to obtain a solid silicone resin a. The obtained silicone resin a contained 6% by weight of OH group. The starting material chlorosilane used was all reacted, and the obtained silicone resin a consisted of 10% by mole of the unit A2 and 90% by mole of the unit A3, also having 60% of phenyl group and 40% of methyl group.

[Silicone Resin b]

206 g (50% by mole) of phenyltrimethoxysilane and 126 g (50% by mole) of dimethyldimethoxysilane were introduced into a flask, and a mixture containing 1.2 g of a 20% aqueous HCl solution and 40 g of water was added dropwise thereto. After completion of dropwise addition, the mixture was subjected to reflux for 1 hour. Subsequently, the resulting solution was cooled to room temperature (25° C.), and then the solution was neutralized with sodium hydrogen carbonate. The obtained organosiloxane solution was filtered to remove any impurities, and then low boiling point substances were distilled off under reduced pressure using a rotary evaporator, thus to obtain a liquid silicone resin b. The obtained silicone resin b contained 9% by weight of hydroxyl group and alkoxy group, as calculated in terms of OH group. The obtained silicone resin b consisted of 50% by mole of the unit A2 and 50% by mole of the unit A3, further having 33% of phenyl group and 67% of methyl group.

[Silicone Resin c]

A mixture containing 182.5 g (90% by mole) of methyltrichlorosilane, 17.5 g (10% by mole) of dimethyldichlorosilane and 215 g of toluene was added dropwise to a mixed solvent containing 550 g of water, 150 g of methanol and 150 g of toluene that had been placed in a flask in advance, over 5 minutes with vigorous agitation. The temperature in the flask was elevated to 75° C., and agitation was continued for 10 more minutes. This solution was left to stand, cooled to room temperature (25° C.). Then, the separated aqueous layer was removed, subsequently water was added, and the mixture was agitated and left to stand. The operation of washing with water to remove the aqueous layer was carried out until the washed water layer became neutral. The remaining organic layer was subjected to reflux for 30 minutes, and water and a part of toluene were distilled off. The obtained toluene solution of organosiloxane was filtered to remove any impurities, and then the residual toluene was distilled off under reduced pressure using a rotary evaporator, thus to obtain a solid silicone resin c. The obtained silicone resin c contained 6% by weight of OH group. The starting material chlorosilane used was all reacted, and the obtained silicone resin c consisted of 10% by mole of the unit A2 and 90% by mole of the unit A3, also having 100% of methyl group.

[Curing Accelerator]

Tetra-n-butylphosphonium-o,o-diethylphosphorodithioate

[Deterioration Preventing Agent]

9,10-Dihydro-9-oxa-10-phosphaphenanthrene-10-oxide

Examples 1 Through 8, and Comparative Examples 1 through 3

The components indicated in the following Table 1 and Table 2 were blended at the ratios indicated in the tables, and epoxy resin compositions were prepared according to the method as described below.

TABLE 1

| | | Example (Parts by weight) | | | | | | | |
|---|---|---|---|---|---|---|---|---|---|
| | | 1 | 2 | 3 | 4 | 5 | 6 | 7 | 8 |
| Epoxy resin | a | 100 | 100 | 100 | — | — | — | 100 | 100 |
| | b | — | — | — | 100 | — | 100 | — | — |
| | c | — | — | — | — | 100 | — | — | — |
| Acid anhydride curing agent | | 168 | 168 | 168 | 120 | 90 | 120 | 168 | 168 |
| Silicone resin | a | 30 | 110 | 400 | 90 | 80 | — | 68 | 180 |
| | b | — | — | — | — | — | 90 | — | — |
| | c | — | — | — | — | — | — | — | — |
| Deterioration preventing agent | | 1 | 1 | 1 | 1 | 1 | 1 | 1 | 1 |
| Curing accelerator | | 1 | 1 | 1 | 1 | 1 | 1 | 1 | 1 |
| Content of silicone resin (wt %) | | 10 | 30 | 60 | 30 | 30 | 30 | 20 | 40 |

TABLE 2

| | | Comparative Example (Parts by weight) | | |
|---|---|---|---|---|
| | | 1 | 2 | 3 |
| Epoxy resin | a | — | 100 | 100 |
| | b | — | — | — |
| | c | 100 | — | — |
| Acid anhydride curing agent | | 90 | 168 | 168 |
| Silicone resin | a | — | — | — |
| | b | — | — | — |
| | c | — | — | 30 |
| Deterioration preventing agent | | 1 | 1 | 1 |
| Curing accelerator | | 1 | 1 | 1 |
| Content of silicone resin (wt %) | | — | — | 10 |

Using each of the epoxy resin compositions thus obtained, light resistance/deterioration, heat resistance, flexural modulus, and compatibility with the epoxy resin composition were measured and evaluated according to the respective following methods. The results are presented in the following Table 3 through Table 5.

[Light Resistance/Deterioration]

Using each of the epoxy resin compositions as described above, an InGaN type (wavelength 405 nm) LED was resin-encapsulated to a shell type lamp having a diameter of 5 mm by potting (120° C.×1 hr), and cured at 150° C. for 3 hr to produce a photosemiconductor device. Further, continuous light emitting of 30 mA (rated 20 mA) was performed at ambient temperature (25° C.), and after 3000 hours, the maintenance against decrease in the brightness was examined (device: Technos Japan Co., Ltd., OPT-DEVICE automatic inspector). The number of the samples of each photosemiconductor device (number n) is set to be 10, and the average thereof is shown.

[Heat Resistance]

Each of the epoxy resin compositions as described above was used to produce a specimen (50 mm×20 mm×thickness 1 mm) as described above (curing condition: 120° C.×1 hr+150° C.×3 hr), and this specimen (cured product) was used to measure the decrease in light transmittance at a wavelength of 450 nm after holding at 150° C. for 500 hours. A spectrophotometer UV3101 manufactured by Shimadzu Corporation was used as a measurement device, to initially measure the light transmittance (initial value) at a wavelength of 450 nm at room temperature (25° C.), and the degree decreased from the initial value was determined.

[Flexural Modulus]

Each of the epoxy resin compositions as described above was used to produce a specimen (100 mm×10 mm×thickness 5 mm) as described above (curing condition: 120° C.×1 hr+150° C.×3 hr), and this specimen (cured product) was used to measure the flexural modulus at ambient temperature (25° C.) with an autograph (Shimadzu Corporation, AG500C) at a head speed of 5 mm/min.

[Compatibility]

Compatibility of each of the epoxy resin compositions as described above (solubility of the silicone resin) was observed in the naked eyes.

[Hardness]

Each of the epoxy resin compositions as described above was used to produce a specimen (thickness 1 mm) as described above (curing condition: 120° C.×1 hr+150° C.×3 hr), and this specimen was used to measure the hardness at room temperature (25° C.) with a Shore D hardness meter (Ueshima Seisakusho Co., Ltd.).

[Glass Transition Temperature]

Each of the epoxy resin composition as described above was used to produce a specimen (20 mm×5 mm×thickness 5 mm) as described above (curing condition: 120° C.×1 hr+150° C.×3 hr). Using the specimen (cured product), the glass transition temperature was measured with a thermomechanical analyzer (TMA, Shimadzu Corporation, TMA-50) at a temperature elevating rate of 2° C./min.

TABLE 3

| | Example | | | | | |
|---|---|---|---|---|---|---|
| | 1 | 2 | 3 | 4 | 5 | 6 |
| Light resistance/deterioration (maintenance against decrease in brightness: %) | 75 | 82 | 85 | 74 | 38 | 72 |
| Heat resistance (Reduction of light transmittance: %) | 80 | 82 | 85 | 79 | 30 | 85 |
| Flexural modulus (N/mm$^2$) | 2700 | 2680 | 2460 | 2520 | 2480 | 2660 |
| Compatibility | Compatible | Compatible | Compatible | Compatible | Compatible | Compatible |
| Hardness (Shore D) | 81 | 80 | 75 | 80 | 83 | 83 |
| Glass transition temperature (° C.) | 172 | 150 | 137 | 150 | 159 | 147 |

TABLE 4

| | Example | |
|---|---|---|
| | 7 | 8 |
| Light resistance/deterioration (maintenance against decrease in brightness: %) | 71 | 82 |
| Heat resistance (Reduction of light transmittance: %) | 80 | 83 |
| Flexural modulus (N/mm$^2$) | 2880 | 2630 |
| Compatibility | Compatible | Compatible |
| Hardness (Shore D) | 81 | 80 |
| Glass transition temperature (° C.) | 178 | 146 |

TABLE 5

| | Comparative Example | | |
|---|---|---|---|
| | 1 | 2 | 3 |
| Light resistance (maintenance against decrease in brightness: %) | 15 | 39 | Evaluation was impossible* |
| Heat resistance (Reduction of light transmittance: %) | 5 | 69 | |
| Flexural modulus (N/mm$^2$) | 2990 | 3110 | |
| Compatibility | — | — | Incompatible |
| Hardness (Shore D) | 68 | 84 | — |
| Glass transition temperature (° C.) | 142 | 210 | — |

*Since the silicone resin was not compatible and the whole system became turbid, the specimen and the photosemiconductor device were not prepared.

From the results above, it was confirmed that the products of Examples had such the results as excellent light resistance; for heat resistance, high degree of maintenance of the light transmittance; low flexural modulus; and excellent low stress property. In contrast, the product of Comparative Example 1 without the use of a silicone resin exhibited low light resistance and heat resistance; and high flexural modulus. For the products of Comparative Example 2 without the use of a silicone resin exhibited very high flexural modulus. Further, the products of Comparative Example 3 with the use of a silicone resin having a methyl group as a substituent did not have compatibility with the silicone resin upon preparation of the epoxy resin composition, and thus the whole system became turbid, the specimen and the photosemiconductor device were not prepared.

While the invention has been described in detail and with reference to specific embodiments thereof, it will be apparent to one skilled in the art that various changes and modifications can be made therein without departing from the scope thereof.

This application is based on Japanese patent application No. 2005-56028 filed Mar. 1, 2005, the entire contents thereof being hereby incorporated by reference.

What is claimed is:

1. An epoxy resin composition for photosemiconductor element encapsulation, which consists of the following components (A) to (E):

(A) an epoxy resin,
(B) an acid anhydride curing agent,
(C) a silicone resin having constituent siloxane units represented by units A1 through A4 represented by the following general formulas (2) through (5), and the respective constitutional ratios for the units A1 through A4 are set to the following ratios (a) through (d):

$$\text{Unit A1:}(R)_3SiO_{1/2} \quad (2)$$

$$\text{Unit A2:}(R)_2(OR^1)_nSiO_{(2-n)/2} \quad (3)$$

wherein n is 0 or 1

$$\text{Unit A3:}(R)(OR^1)_nSiO_{(3-n)/2} \quad (4)$$

wherein n is 0, 1 or 2

$$\text{Unit A4:}(OR^1)_nSiO_{(4-n)/2} \quad (5)$$

wherein n is an integer from 0 to 3
wherein R is a substituted or unsubstituted, saturated monovalent hydrocarbon group having 1 to 18 carbon atoms or aromatic hydrocarbon group having 6 to 18 carbon atoms, and a plurality of R may be the same or different; and R$^1$ is a hydrogen atom or an alkyl group having 1 to 6 carbon atoms, and a plurality of R$^1$ may be the same or different, (a) 0 to 30% by mole of unit A1,
(b) 10 to 80% by mole of unit A2,
(c) 20 to 90% by mole of unit A3, and
(d) 0 to 30% by mole of unit A4, wherein the silicone resin has at least one hydroxyl group or alkoxy group bonded to a silicon atom per molecule, wherein substituted or unsubstituted aromatic hydrocarbon groups occupy 10% by mole or greater among the monovalent hydrocarbon groups (R) bonded to silicon atoms, and wherein the amount of the hydroxyl group or alkoxy group bonded to a silicon atom is set to the range of 0.1 to 15% by weight in terms of the OH group, (D) a hardening accelerator, and (E) a deterioration inhibitor.

2. The epoxy resin composition for photosemiconductor element encapsulation according to claim 1, wherein the monovalent hydrocarbon groups (R) bonded to silicon atoms of the silicone resin which is the component C are a methyl group and a phenyl group.

3. The epoxy resin composition for photosemiconductor element encapsulation according to claim 1, wherein the silicone resin which is the component C has a softening point of 150° C. or lower, or is a liquid at ambient temperature, and exhibits uniform compatibility with the epoxy resin which is the component A.

4. A photosemiconductor device which comprises the epoxy resin composition for photosemiconductor element encapsulation according to any one of claims 1, 2 or 3 and a photosemiconductor element encapsulated with the epoxy resin.

* * * * *